US006695947B2

(12) United States Patent
Eriguchi

(10) Patent No.: US 6,695,947 B2
(45) **Date of Patent: *Feb. 24, 2004**

(54) DEVICE FOR MANUFACTURING SEMICONDUCTOR DEVICE AND METHOD OF MANUFACTURING THE SAME

(75) Inventor: Koji Eriguchi, Kusatsu (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

This patent is subject to a terminal disclaimer.

(21) Appl. No.: 10/150,082

(22) Filed: May 20, 2002

(65) Prior Publication Data

US 2002/0129476 A1 Sep. 19, 2002

Related U.S. Application Data

(62) Division of application No. 09/427,586, filed on Oct. 27, 1999, now Pat. No. 6,395,563.

(30) Foreign Application Priority Data

Dec. 28, 1998 (JP) .......................................... 10-124797
Dec. 28, 1998 (JP) .......................................... 10-372153

(51) Int. Cl.[7] .......................... C23F 1/00; H01L 21/306

(52) U.S. Cl. .................. 156/345.31; 118/719; 414/939; 156/345.24

(58) Field of Search ....................... 156/345.24, 345.32, 156/345.31; 118/719; 356/445

(56) References Cited

U.S. PATENT DOCUMENTS 4,851,311 A 7/1989 Millis et al.
5,413,941 A 5/1995 Koos et al.
5,766,360 A * 6/1998 Sato et al. .................. 118/666
5,838,448 A 11/1998 Aiyer et al.
5,985,032 A * 11/1999 Eriguchi ..................... 118/712
6,040,198 A 3/2000 Komiya et al.
6,113,733 A * 9/2000 Eriguchi et al. ....... 156/345.24
6,153,444 A 11/2000 Nakano et al.
6,081,334 A 12/2000 Grimbergen et al.
6,214,734 B1 4/2001 Bothra et al.
6,228,277 B1 5/2001 Kornblit et al.
6,271,047 B1 8/2001 Ushio et al.
6,287,879 B1 9/2001 Gonzales et al.
6,309,555 B1 10/2001 Chen
6,340,602 B1 1/2002 Johnson et al.
6,426,502 B1 * 7/2002 Finarov ...................... 250/348
6,521,080 B2 * 2/2003 Balasubramhanya et al. ..................... 156/345.24

* cited by examiner

*Primary Examiner*—Parviz Hassanzadeh
*Assistant Examiner*—Karla Moore
(74) *Attorney, Agent, or Firm*—Nixon Peabody LLP; Donald R. Studebaker

(57) ABSTRACT

There is provided a clustered device for manufacturing a semiconductor device in which a cleaning chamber, a rapid thermal processing chamber, an optical measurement chamber, and the like are arranged around a load-lock room. In an optical measurement system, there are disposed an exciting light source, a measuring light source, a light detector, a control/analyze system, and the like. During the formation of an oxide film, for example, a wafer is cleaned in the cleaning chamber and then the amount of a natural oxide film remaining on the wafer or the like is measured by optical modulation reflectance spectroscopy in the optical measurement chamber. As a result, the surface state of the wafer can be monitored in the course of sequential process steps. By measuring the thickness of a film on a semiconductor region by optical evaluation in the clustered manufacturing device, the manufacturing process using the clustered device can be controlled.

4 Claims, 13 Drawing Sheets

CONTROL/
ANALYZE
SYSTEM
1 2 3 4 5 6 7 8 9 10 11 12 13

DEVICE FOR MANUFACTURING SEMICONDUCTOR DEVICE AND METHOD OF MANUFACTURING THE SAME

BACKGROUND OF THE INVENTION

The present invention relates to a device for manufacturing a semiconductor device and a method of manufacturing the same. More particularly, it relates to property control of a surface of a semiconductor layer and a film formed thereon in a manufacturing process performed by using a clustered manufacturing device in an atmosphere insulated from an external space.

As the packaging density of a semiconductor integrated circuit has increased in recent years, miniaturization and higher performance have been required of an element composing a MOS device, such as a transistor. However, the miniaturization of an element such as a transistor should not reduce the reliability of the whole device. Therefore, both miniaturization and increased reliability are required of each component of an element such as a transistor.

In particular, a gate insulating film (gate oxide film), which is an essential component of a MOS device, has rapidly been reduced in thickness. It is expected that an extremely thin insulating film with a thickness of 4 nm or less will be used in the twenty-first century. Since the properties of the gate insulating film are said to determine the properties of the MOS transistor and the electric properties of a semiconductor integrated circuit, the formation of an insulating film with excellent properties has been in great demand.

It has been proved that the properties of an insulating film are largely dependent on the surface state of a semiconductor layer before the insulating film is formed thereon. Accordingly, there has been studied a cleaning method for improving the properties of the semiconductor layer or the like. For example, it has been reported that the use of a cleaning method (pregate cleaning process) which minimizes the undulations of a surface of a Si substrate allows the formation, on the laboratory level, of a high-quality gate oxide film with an extremely small thickness of about 1.2 nm.

There has also been reported a clustered manufacturing device which allows sequential process steps from pregate cleaning to gate insulating film formation to be performed without exposing wafers to an atmosphere and thereby prevents the formation of a natural oxide film and the deposition of a contaminant resulting from exposure to the atmosphere (Document 1: Schuegraf et. al., IEEE/International Reliability and Physics Symposium 97, p. 7). It has been proved that a high-quality gate insulating film can be formed by the manufacturing process using the clustered manufacturing device. The use of the clustered manufacturing device is particularly desirable in the step of forming a gate insulating film having a reduced thickness of 4 nm or less.

On the other hand, property control of the gate insulating film in a MOS device has been performed conventionally by forming an element such as a MOS capacitor or MOS transistor and analyzing the electric properties of the element. If any trouble occurs in the step of forming the gate insulating film, the procedure is followed in which the trouble is found by evaluating the electric properties of the MOS capacitor or the like that has been formed previously, diagnosing the cause of the trouble, and practicing a troubleshooting method. As a result, a large quantity of gate insulating films with degraded electric properties are formed consecutively till the trouble is found, which reduces production efficiency.

If an ellipsometer used conventionally for measuring a film thickness in the manufacturing process is used to measure the thickness of a thin film, it does provide a measured value, but the minimum film thickness that can be measured with reliability is on the order of 10 nm. It can hardly be said that a film thickness smaller than 10 nm is measurable with sufficiently high accuracy. Thus far, a reliable evaluation method which is usable for an extremely thin film with a thickness of about 4 nm or less in the manufacturing process has not been established yet.

Although the electric properties of a MOS capacitor or the like formed on a wafer are measured after a large number of sequential process steps were performed with respect to the wafer in the process using the clustered manufacturing device described above, there is no method of controlling the condition of the wafer in the course of the process steps. Despite the fact that a high-quality gate insulating film is formable on the laboratory level, there is no guarantee, under present circumstances, that high-quality gate insulating films can be formed in the process of mass-producing MOS devices even by using the clustered manufacturing device.

SUMMARY OF THE INVENTION

It is therefore a first object of the present invention to provide a method of manufacturing a semiconductor device incorporating an optical evaluation method which can provide sufficient reliability and accuracy in measuring the properties of an extremely thin film.

A second object of the present invention is to provide a method and device for manufacturing a semiconductor device which allow optical measurement of the properties of an insulating film, especially the thickness thereof, and provide a method of property control in sequential process steps from pregate cleaning to insulating film formation, which are performed by using a clustered manufacturing device.

A device for manufacturing a semiconductor device of the present invention is a clustered device comprising: a plurality of processing rooms for processing a wafer having a semiconductor region; a shared container enclosing a space containing the plurality of processing rooms such that the space is held in an atmosphere disconnected from an external space; transporting means for transporting the wafer within the shared container; and optical measuring means for optically evaluating a surface state of the wafer being disposed at any site in the shared container.

The arrangement allows optical evaluation of the surface state of a wafer in a situation unaffected by a natural oxide film formed on the wafer or contamination deposited thereon by exposing the wafer to the external space. By thus optically evaluating the surface state of the wafer after the removal of the film or after the formation of the film, the thickness of an oxide film or the like can be measured with high accuracy. Since the wafer need not be extracted, for optical evaluation, to the outside of the shared container, the process of manufacturing a semiconductor device can be controlled properly by using in-line evaluation without adversely affecting the wafer in the manufacturing process.

In the device for manufacturing a semiconductor device, the optical measuring means can be comprised of: a first light source for generating exciting light; a second light source for generating measuring light; a first light guiding member for intermittently irradiating the semiconductor region of the wafer in the shared container with the exciting light generated from the first light source; a second light guiding member for irradiating the semiconductor region with the measuring light generated from the second light source; reflectance measuring means for measuring the reflectance of the measuring light with which the semiconductor region is irradiated; a third light guiding means for causing the measuring light reflected by the semiconductor region to be incident upon the reflectance measuring means; and change calculating means for receiving an output of the reflectance measuring means and calculating a change rate of reflectance of the measuring light by dividing the difference between the reflectances of the measuring light when the semiconductor region is irradiated and not irradiated with the exciting light by the reflectance of the measuring light when the semiconductor region is not irradiated with the exciting light.

This achieves the following effect. When the semiconductor region is irradiated with the exciting light guided by the first light guiding member, carriers in the semiconductor region are excited to produce an electric field. Under the influence of the electric field, the reflectance of the measuring light guided to the semiconductor region by the second light guiding member changes in the presence or absence of the radiation of exciting light. The change rate varies based on the magnitude of the intensity of the electric field and on the wavelength of the measuring light. If a defect serving as the center of recombination for carriers exists in a near-surface portion of the semiconductor region, the lifespan of the excited carriers is reduced, so that the intensity of the electric field formed by carriers is reduced. That is, the change rate of reflectance in the presence or absence of the radiation of exciting light changes based on the number of defects present in the near-surface portion of the semiconductor region. If there is a film on the semiconductor region, the process of capturing electrons proceeds with an increase in the thickness of the film so that the change rate of reflectance increases. If the change rate of reflectance of the measuring light in the semiconductor region is calculated by the change calculating means from the value measured by the reflectance measuring means, the change rate of reflectance includes data on the crystallized state of the semiconductor region, on the presence or absence of a film, or on the thickness of the film. Based on the change rate of reflectance, therefore, the surface state of the wafer can be evaluated with high sensitivity.

In the device for manufacturing a semiconductor device, the plurality of processing rooms include a processing room for performing a cleaning process involving an etching effect with respect to the wafer and a processing room for forming a film on the semiconductor region of the wafer. The arrangement allows optical evaluation in the situation in which the film has been removed from the wafer or in which a film has been formed on the wafer thereafter, thus allowing optical evaluation of the cleaned wafer surface without the natural oxide film.

The device for manufacturing a semiconductor device can further comprise an optical measurement room provided within the shared container, wherein the optical measuring means is disposed in the optical measurement room.

In the device for manufacturing a semiconductor device, the processing room for forming a film on the wafer is so constructed as to form an oxide film by performing a thermal oxidation process with respect to the semiconductor region of the wafer, the clustered device further comprising a processing room for forming a conductor film on the oxide film, the processing room being provided within the shared container. The arrangement allows the formation of the conductor film on the wafer formed with the thermal oxide film without exposing the wafer to the external space. Consequently, there can be formed a semiconductor device such as a MOS transistor having an oxide film with a small thickness which is controlled with high accuracy.

A first method of manufacturing a semiconductor device of the present invention includes formation of a film on a semiconductor region of a wafer or removal of a film from a surface of the semiconductor region of the wafer, the method comprising the steps of: (a) irradiating the semiconductor region of the wafer with measuring light; (b) intermittently irradiating the semiconductor region of the wafer with exciting light; and (c) calculating a change rate of reflectance by dividing the difference between the reflectances of the measuring light when the semiconductor region of the wafer is irradiated and not irradiated with the exciting light by the reflectance of the measuring light when the semiconductor region is not irradiated with the exciting light, wherein the thickness of the film is determined based on the change rate of reflectance.

In accordance with the method, data on the thickness of a film formed on the semiconductor region can be obtained by evaluation based on optical modulation reflectance spectroscopy by utilizing the phenomenon that the presence of the film in the semiconductor region under measurement performed by optical modulation reflectance spectroscopy causes the process of capturing electrons with an increase in the thickness of the film and hence increases the change rate of reflectance. In the measurement performed by ellipsometry currently used, a measurement error becomes extremely large or measurement sensitivity cannot be obtained at all if the film thickness is reduced to 4 nm or less. By contrast, optical modulation reflectance spectroscopy allows precise measurement of the thickness of such a thin film.

In the first method of manufacturing a semiconductor device, the step (c) includes producing a spectrum indicative of the change rate of reflectance when the wavelength of the measuring light is varied and determining the thickness of the film based on a peak value which is a maximum absolute value of the change rate of reflectance. This allows high-sensitivity measurement of the film thickness.

Alternatively, the step (c) includes producing a spectrum indicative of the change rate of reflectance when the wavelength of the measuring light is varied and determining the thickness of the film based on a peak-to-peak value which is the difference between a positive maximum value of the change rate of reflectance and a negative maximum value thereof. This allows highest-sensitivity measurement of the film thickness.

In the first method of manufacturing a semiconductor device, the step (c) includes determining the thickness of the film based on the change rate of reflectance at a constant wavelength close to the wavelength of the measuring light indicative of a peak value which is a maximum absolute value of the change rate of reflectance. This reduces the time required for the measurement of the film thickness.

In the first method of manufacturing a semiconductor device, even when the thickness of the film is 2 nm or less, which cannot be measured by the conventional optical measurement method, the film thickness can be measured with high sensitivity.

When the thickness of the film is 1 nm or less, in particular, the optical evaluation is performed with respect to a p-type semiconductor region as the semiconductor region.

This provides high measurement sensitivity and high measurement accuracy.

In the first method of manufacturing a semiconductor device, the thickness of the film is measured in each of a p-type semiconductor region and an n-type semiconductor region as the semiconductor region. If the thickness of the film is measured to be 1 nm or less, the value measured in the p-type semiconductor region is used as the thickness of the film. If the thickness of the film is measured to be over 1 nm, the value measured in the n-type semiconductor region is used as the thickness of the film. As a result, the thickness of an extremely thin film can be measured with highest sensitivity by using the phenomenon that characteristics representing the relationship between the change rate of reflectance and the film thickness differ if the conductivity type of the semiconductor region is different.

In the first method of manufacturing a semiconductor device, the semiconductor region has preferably a resistivity of 0.1 $\Omega cm^{-1}$ or less.

A second method of manufacturing a semiconductor device of the present invention is practiced by using a clustered device for manufacturing the semiconductor device, comprising a plurality of processing rooms, a shared container enclosing a space containing the plurality of processing rooms such that the space is held in an atmosphere disconnected from an external space, and transporting means for transporting the wafer within the shared container, the method comprising the steps of: (a) forming a film on the wafer or removing a film from a surface of the wafer in one of the plurality of processing rooms; and (b) determining the thickness of the film by optically evaluating a surface state of the wafer at any site in the shared container.

In accordance with the method, the thickness of the film on the wafer can be calculated by optical evaluation performed in the course of sequential process steps continuously performed or when the sequence of process steps are completed and an atmosphere of the external space is about to be restored. This allows a judgment of whether conditions for one of sequential process steps or for the entire process steps performed in the clustered manufacturing device are appropriate or not or a pass/fail judgment of the film formed on the wafer.

In the second method of manufacturing a semiconductor device, the step (b) includes the substeps of: (x) irradiating a semiconductor region of the wafer with measuring light; (y) intermittently irradiating the semiconductor region of the wafer with exciting light; and (z) calculating a change of reflectance by dividing the difference between the reflectances of the measuring light when the semiconductor region of the wafer is irradiated and not irradiated with the exciting light by the reflectance of the measuring light when the semiconductor region is not irradiated with the exciting light, so that the thickness of the film is determined based on the change rate of reflectance.

The method allows the determination of the thickness of an extremely thin film or of the presence or absence thereof in a clustered device by using the fact that data on the thickness of the film can be obtained by optical modulation reflectance spectroscopy, as described above.

In the second method of manufacturing a semiconductor device, the step (a) includes removing a natural oxide film from a surface of the wafer and the step (b) includes determining the thickness of the natural oxide film. As a result, an extremely thin natural oxide film with a thickness of several nanometers can be removed optimally.

In the second method of manufacturing a semiconductor device, there is further provided the step of (c) controlling the time of processing such that the natural oxide film remaining on the wafer has a thickness equal to or smaller than a specified value. As a result, the thickness of the natural oxide film can be held at a most preferred value.

In the second method of manufacturing a semiconductor device, the step (a) may include forming a gate insulating film on the wafer and the step (b) may include determining the thickness of the gate insulating film.

In the second method of manufacturing a semiconductor device, the step (a) may further include forming, on the gate insulating film, a conductor film for a gate electrode and the method may further comprise, after the step (b), the step of (c) controlling the thickness of the gate insulating film based on the change rate of reflectance calculated in the step (b) prior to the formation of the conductor film for a gate electrode.

In the second method of manufacturing a semiconductor device, the step (b) preferably includes measuring the change rate of reflectance in each of the p-type semiconductor region and the n-type semiconductor region and determining the thickness of a natural oxide film based on the dependent property of the p-type semiconductor region or the n-type semiconductor region providing the higher change rate of reflectance.

DETAILED DESCRIPTION OF THE INVENTION

Process Performed in Clustered Manufacturing Device

Prior to the description of a device for manufacturing a semiconductor device according to the embodiments of the present invention, a description will be given to a method not using a clustered manufacturing device and a method using a clustered manufacturing device in performing sequential process steps from cleaning to gate insulating film formation.

Figure 17A:
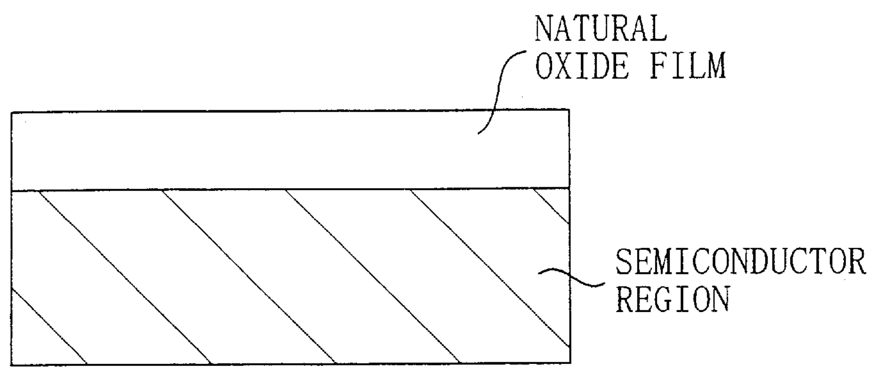
FIGS. 17*a* to 17*c* are cross-sectional views illustrating a manufacturing process for performing sequential process steps from cleaning to gate insulating film formation with respect to a wafer without using a clustered manufacturing device.
Figure 17B:
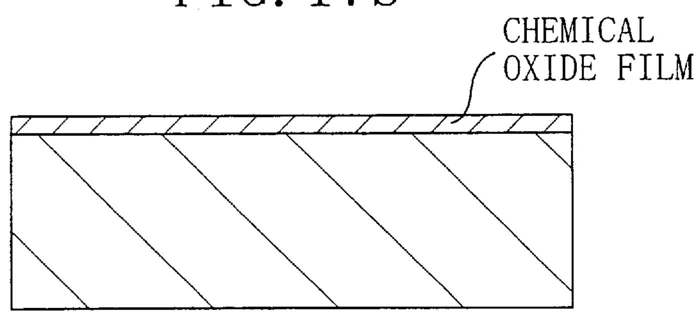
Figure 17C:
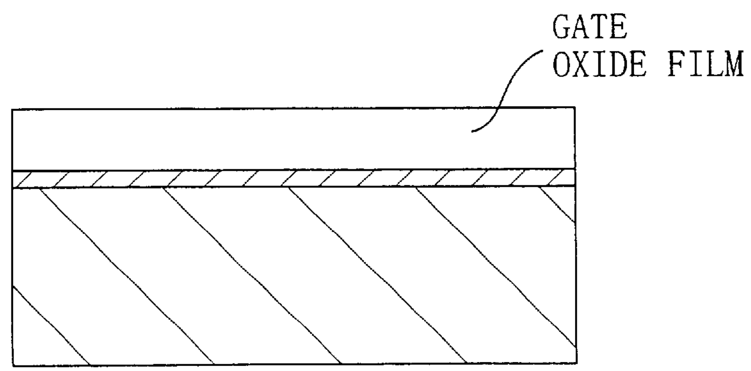

FIGS. 17*a* to 17*c* are cross-sectional views illustrating the method not using the clustered manufacturing device. FIG. 17*a* shows a wafer prior to cleaning. As shown in FIG. 17*a*, a natural oxide film has been formed on a semiconductor region. Then, in the step shown in FIG. 17*b*, cleaning for removing the oxide film, i.e., acid treatment or the like is performed. In the step, cleaning with ammonium is conducted intentionally to form a chemical oxide film on the semiconductor region. Next, in the step shown in FIG. 17*c*, a thermal oxidation process or the like is performed to form an oxide film on the semiconductor region via the chemical oxide film.

Figure 18A:
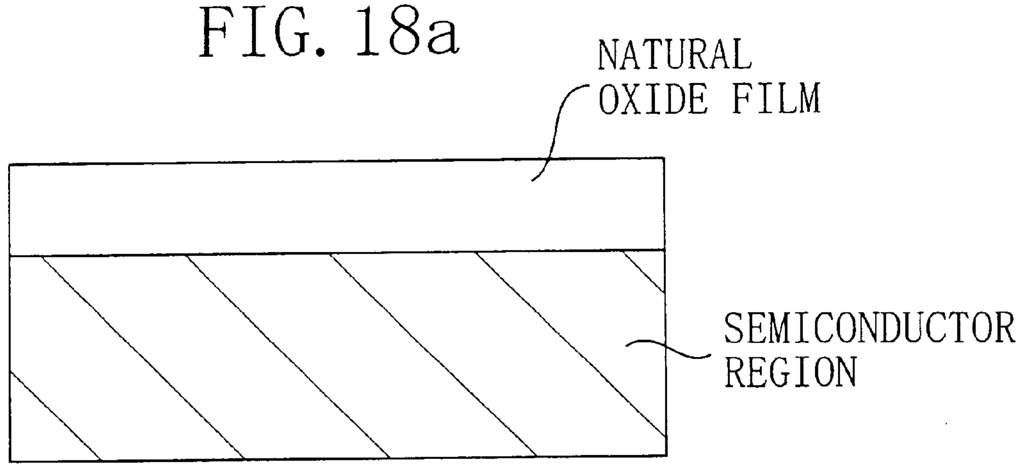
FIGS. 18*a* to 18*c* are cross-sectional views illustrating an example of a manufacturing process for performing sequential process steps from cleaning to gate insulating film formation with respect to a wafer by using a clustered manufacturing device.
Figure 18B:
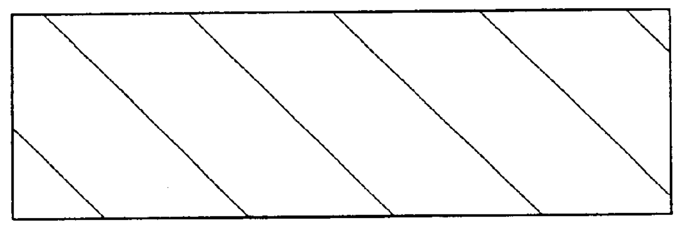
Figure 18C:
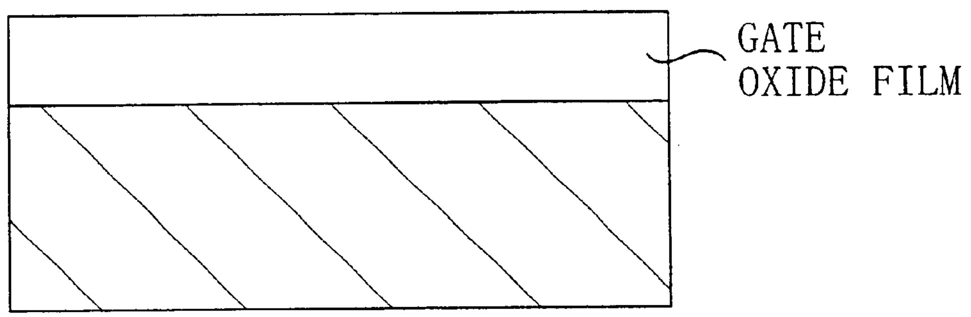

On the other hand, FIGS. 18*a* to 18*c* are cross-sectional views illustrating an example of the method using the clustered device for manufacturing a semiconductor device. FIG. 18*a* shows a wafer carried in the clustered device for manufacturing a semiconductor device. A natural oxide film has been formed on a semiconductor region, similarly to the first method. Then, in the step shown in FIG. 18*b*, cleaning for removing the oxide film, i.e., acid treatment or the like is performed. In the step, the natural oxide film is removed completely so that the surface of the semiconductor region is exposed. Next, in the step shown in FIG. 18*a*, a thermal oxidation process or the like is performed to form a gate insulating film on the semiconductor region.

Figure 19A:
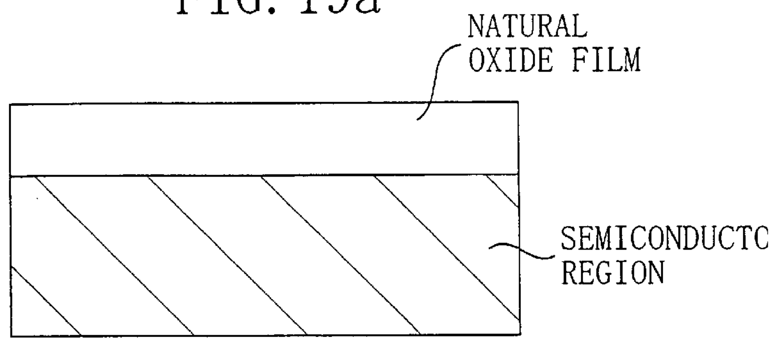
FIGS. 19*a* to 19*d* are cross-sectional views illustrating another example of the manufacturing process for performing sequential process steps from cleaning to gate insulating film formation with respect to a wafer by using a clustered manufacturing device.
Figure 19B:
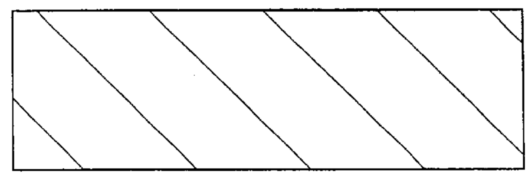
Figure 19C:
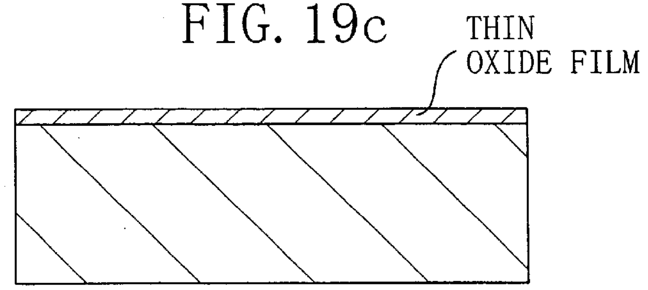
Figure 19D:
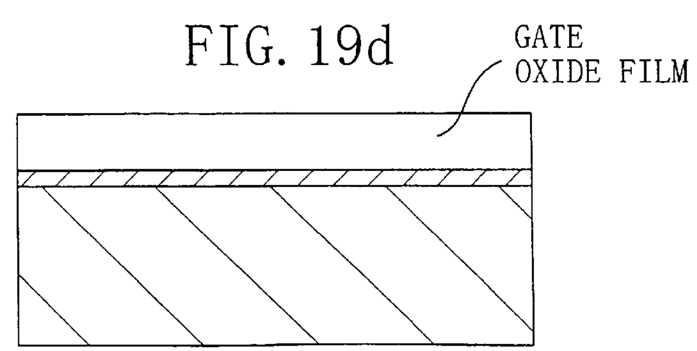

FIGS. 19*a* to 19*d* are cross-sectional view illustrating another example of the method using the clustered device for manufacturing a semiconductor device. In the process illustrated in FIGS. 19*a* to 19*d*, basically the same process as illustrated in FIGS. 18*a* to 18*c* is performed. In this example, however, an extremely thin oxide film is formed on the semiconductor region, as shown in FIG. 19*c*. In addition, a thermal oxidation process or the like is performed in the step shown in FIG. 19*d*, so that a gate oxide film is formed on the semiconductor region.

Each of the following first and second embodiments has performed sequential process steps from cleaning to oxide film formation by using either one of the methods illustrated in FIGS. 18*a* to 18*c* and in FIGS. 19*a* to 19*d*.

Embodiment 1

Structure of Clustered Chamber

Figure 1:
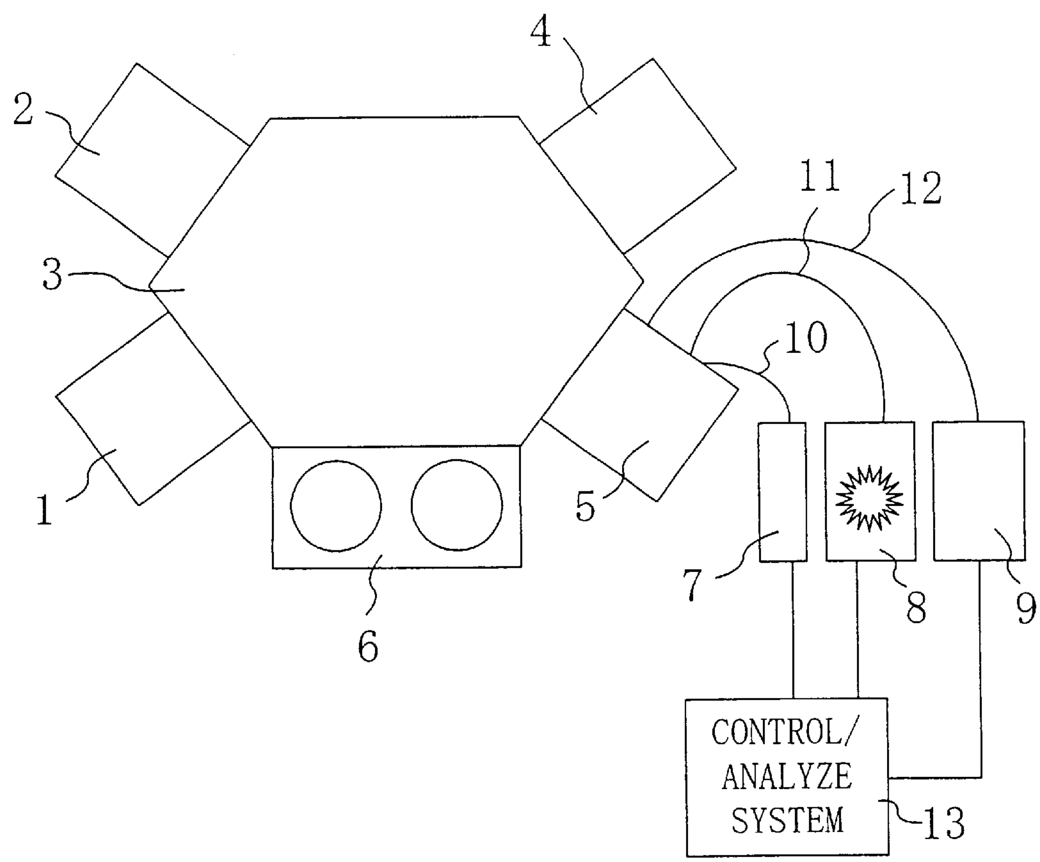
FIG. 1 is a block diagram diagrammatically showing a structure of a clustered device for manufacturing a semiconductor device used in each of first to third embodiments of the present invention.

FIG. 1 is a block diagram diagrammatically showing a structure of a clustered device for manufacturing a semiconductor device according to the present embodiment. In FIG. 1 are shown: a cleaning chamber 1; a rapid thermal processing chamber 2; a load-lock room 3; a wafer cooling chamber 4; an optical measurement chamber 5; and a wafer load/unload port 6. That is, the load-lock room 3 and the individual chambers 1, 2, 4, and 5 mounted thereon like clusters function as a shared container enclosing a space in an atmosphere under reduced pressure which is disconnected from an external space, thereby forming a so-called clustered manufacturing device. In the step of forming an oxide film, e.g., wafers are cleaned in the cleaning chamber 1 and subsequently oxidized in the rapid thermal processing chamber 2. At this time, the natural oxide films on the wafers are removed in the wafer cleaning step. The load-lock room 3 is so structured as to optimize the transfer of the wafers to be processed and the inside of the load-lock room 3 is under reduced pressure. Accordingly, the surfaces of the wafers are prevented from being exposed to an atmosphere and thereby oxidized even after the cleaning step is completed.

The present embodiment is characterized in that the optical measurement chamber 5 is disposed in the shared space of the clustered manufacturing device and that an exciting light source 7 (Ar ion laser), a measuring light source 8 (150 W Xe lamp), an optical detector 9 for measuring the intensity of reflected measuring light, optical fibers 10, 11, and 12 serving as light guiding paths between the optical measurement chamber 5 and the exciting light source 7, measuring light source 8, and optical detector 9, respectively, and a control/analyze system 13 for controlling equipment and calculating/analyzing data during measurement by optical modulation reflectance spectroscopy.

Optical Measurement System

Figure 2:
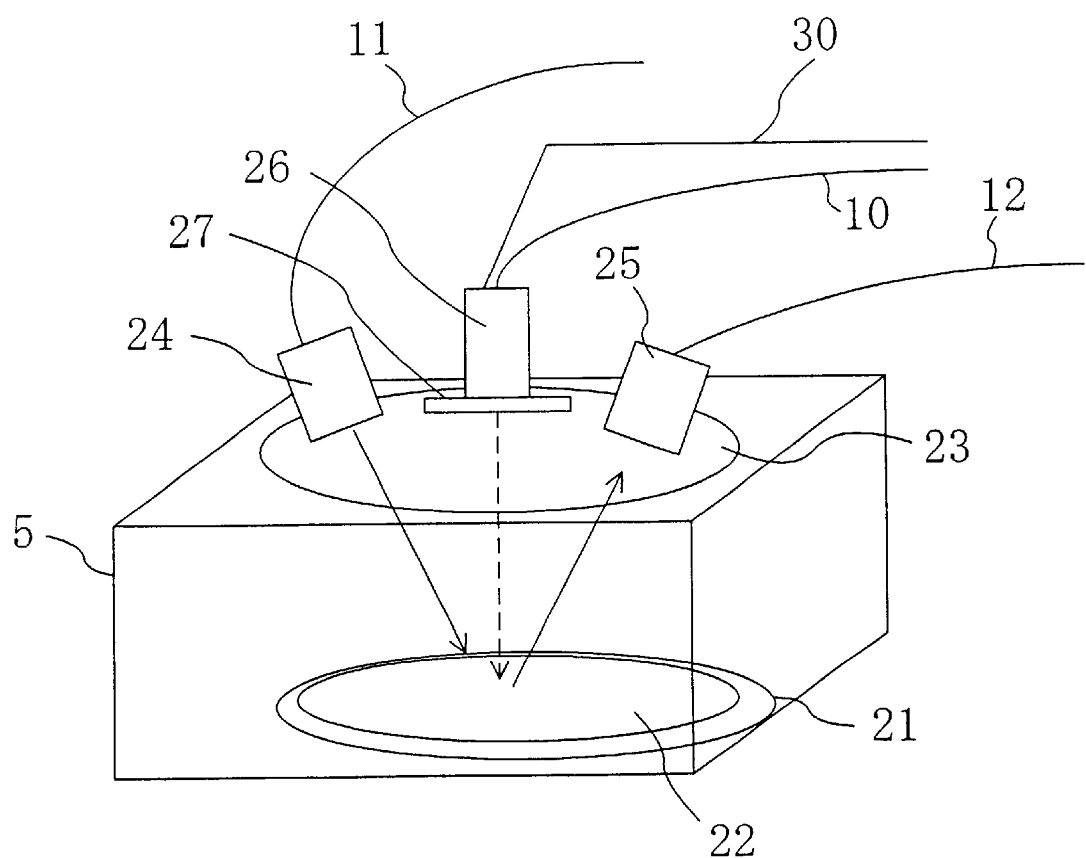
FIG. 2 is a cross-sectional view schematically showing a structure of an optical measurement mechanism used in each of the first to third embodiments.

FIG. 2 is a perspective view schematically showing an optical measurement system disposed in the device for manufacturing a semiconductor device.

In FIG. 2 are shown: a wafer stage 21; a wafer 22; a quartz window 23; an incident measuring light inlet 24; a reflected measuring light outlet 25; an exciting light inlet 26; a light shield plate 27 for blocking stray light which is the exciting light incident on the wafer 22 and reflected thereby; and a signal line 30 for providing a connection between the exciting light inlet 26 and the control/analyze system 13. Each of the incident measuring light inlet 24, reflected measuring light outlet 25, and exciting light inlet 26 has the function as an optical fiber supporter. The exciting light inlet 26 is provided with an additional chopper for intermittently irradiating an object under measurement with the exciting light at a frequency of 500 Hz, though it is not shown in the drawing. The chopper is controlled by the control/analyze system to operate in synchronization with the optical detector 9. Thus, the device for manufacturing a semiconductor device according to the present embodiment is so structured as to form a high-quality gate insulating film without trouble by controlling the manufacturing process, while optically monitoring the wafer in sequential process steps from cleaning to gate insulating film formation.

Principle of Measurement by Optical Modulation Reflectance Spectroscopy

Hereinafter, the principle of measurement by optical modulation reflectance spectroscopy will be described with reference to the structure of the measurement system of the present embodiment shown in FIG. 2. The exciting light generated from the exciting light source 7 is supplied into the optical measurement chamber 5 via the additional chopper provided in the exciting light inlet 26 for intermittent irradiation of the semiconductor region of the wafer 22. In the present embodiment, the semiconductor region is of n-type. The value ($\Delta R/R$) obtained by dividing, by the intensity R of reflected measuring light when the semiconductor region is not irradiated with the exciting light, the difference $\Delta R$ between the intensities of reflected measuring light when the semiconductor region is irradiated and not irradiated with exciting light is detected as the change rate of reflection intensity by the control/analyze system 13. Variations in the change rate of reflection intensity are monitored by the foregoing structure. It is unnecessary to dispose a polarizer at the measuring light incident side and an analyzer at the measuring light reflecting side, unlike the case where measurement is performed by using an ellipsometer. However, it is possible to add the function of ellipsometry by optionally disposing the polarizer and analyzer.

The foregoing change rate ($\Delta R/R$) of reflection intensity is obtained by the following action. In general, the irradiation of a semiconductor region with light increases the number of carriers excited by the light. When the carriers return to the original energy level thereafter, they emit light and disappear. As the number of carriers changes, the intensity of an electric field changes in the area of the semiconductor region irradiated with the exciting light. Accordingly, the intensity of reflected measuring light in the presence of the radiation of exciting light is different from that in the absence of the radiation of exciting light. If a large number of defects exist in a near-surface portion of the semiconductor region, however, an interface state at a low energy level is produced by the defects. Since the defects forming such an interface state function as a layer for capturing the carriers, if the carriers excited under the radiation of light are captured by the defects and cannot reach a sufficiently high energy level or if the carriers excited to a high energy level are captured by the defects, the intensity of light generated when the excited carriers return to a lower energy level is reduced. As a result, the intensity of the electric field in the area of the semiconductor region irradiated with the exciting light changes. Accordingly, the change rate ($\Delta R/R$) of reflection intensity also changes depending on the number of capture levels in the near-surface portion of the semiconductor region. If a film exists on the semiconductor region and the capturing of electrons in the near-surface portion of the semiconductor region is remarkable, a variation in the change rate ($\Delta R/R$) of reflectance increases. Therefore, data on a physical state in the near-surface portion of the semiconductor region can be obtained by monitoring the change rate of reflection intensity.

It is assumed that the frequency for chopping is related to the time elapsed from the recombination of the carriers to the changing of the intensity of the electric field in the semiconductor region. It has been proved experimentally that the frequency for chopping is preferably 1 kHz or lower and, more preferably, 500 Hz or lower. In addition, the photon energy of the exciting light is preferably larger than the band gap of the semiconductor region. When a silicon substrate is used, exciting light at a wavelength with photon energy of 1.1 eV or more is used preferably. The foregoing statement holds true in each of the embodiments described later.

Since the radiation intensity of the measuring light (at each wavelength range) is assumed to be constant in the present embodiment, the detection of reflection intensity is conducted as a substitute for the detection of reflectance. Specifically, the measurement of the change rate of reflection intensity is performed by intermittently irradiating the semiconductor region of the wafer 22 with an Ar ion laser beam as the exciting light, while continuously irradiating the semiconductor region with a light beam from a Xe lamp as the measuring light, and detecting a variation in the reflection intensity of the measuring light. Briefly, the value ($\Delta R/R$) obtained by dividing, by the reflection intensity R when the semiconductor region is not irradiated with the exciting light, the difference $\Delta R$ between the reflection intensities when the semiconductor region is irradiated with and not irradiated with the exciting light is detected as the change rate of reflectance. In short, light modulation reflectance spectroscopy is a method of examining a spectral configuration obtained by varying the wavelength of probe light, while repeatedly and intermittently performing irradiation with the exciting light, and measuring the change rate of reflectance at each wavelength (energy value of light) of the probe light.

Figure 8:
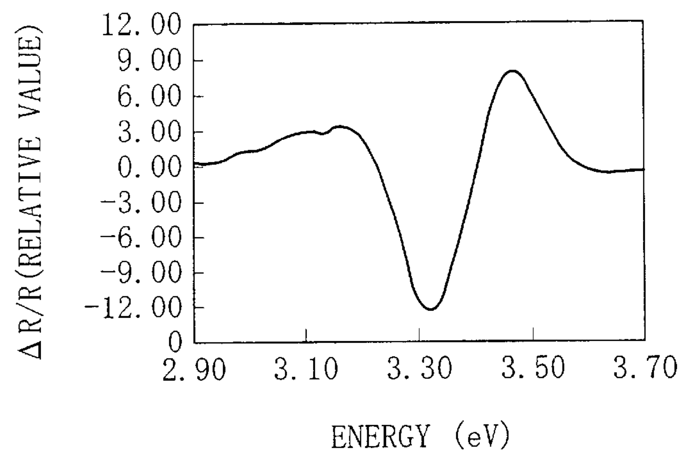
FIG. 8 is a spectral diagram showing a basic configuration obtained by optical modulation reflectance spectroscopy in accordance with the present invention.

FIG. 8 is a spectral diagram in a basic pattern representing the relationship between the value of photon energy which is proportional to the reciprocal of the wavelength $\lambda$ of probe light incident upon a single-crystal silicon layer as the semiconductor region and the change rate ($\Delta R/R$) of reflectance. The change rate ($\Delta R/R$) of reflectance shown in FIG. 8 is a relative value which is zero in the initial state. The region in which the change rate ($\Delta R/R$) of reflectance varies most remarkably is adjacent the negative peak value shown in FIG. 8. Therefore, the present embodiment assumes that a peak value indicates the negative peak value and uses 376 nm corresponding to about 3.30 eV as the wavelength of the probe light at the negative peak value, which is approximately equal to an energy value indicative of the negative peak value. In the foregoing description, the distance between the negative peak value and the positive peak value is termed “peak-to-peak value”.

In obtaining the spectral configuration, it is preferable to detect and analyze the spectrum of the probe light in the wavelength range of 200 to 500 nm.

Control of Cleaning Step and Optical Measurement

A description will be given next to sequential process steps from cleaning to gate insulating film formation, which is performed by using the device for manufacturing a semiconductor device and optical measurement system described above.

First, product wafers including an advanced wafer (monitor wafer) are transferred from the wafer load/unload port 6 into the load-lock room 3 so that the natural oxide films on the wafers are removed. Each of the wafers is internally formed with an n-type semiconductor region having a resistivity of 0.02 $\Omega cm^{-1}$ for high-sensitivity measurement. The pressure inside the load-lock room 3 has been reduced to about 50 mTorr. The advanced wafer is initially introduced from the load-lock room 3 into the cleaning chamber 1 such that a surface of the wafer is cleaned by using HF vapor and etched by using radicals produced by dissociating $Cl_2$ gas under UV irradiation, whereby the natural oxide film is removed and a flat interface is formed. For this purpose, anticorrosive treatment or the like has been performed with respect to the cleaning chamber 1.

At this stage, the wafer is temporarily carried in the optical measurement chamber 5 so that the state of the semiconductor region is examined by optical modulation reflectance spectroscopy described above.

Figure 3:
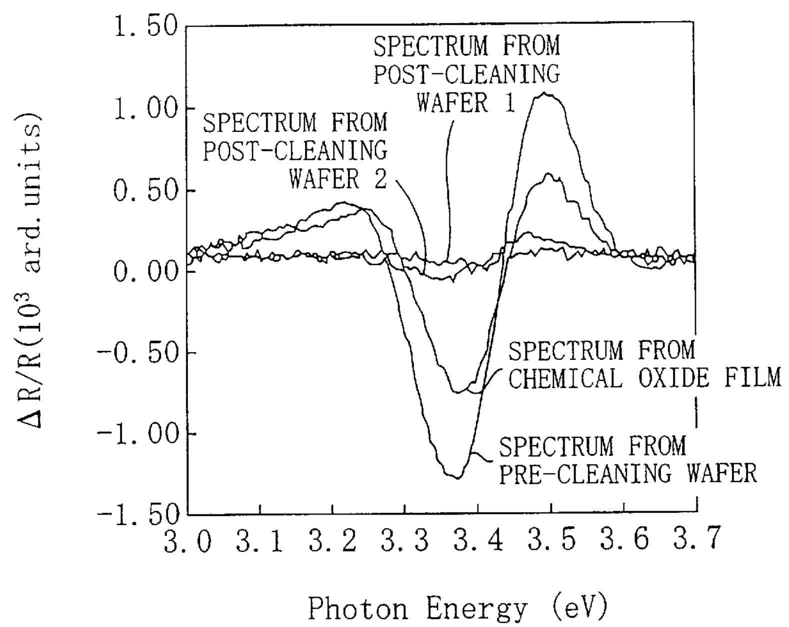
FIG. 3 is a spectral diagram showing reflectances measured by optical modulation reflectance spectroscopy in the first embodiment.

FIG. 3 is a spectral diagram showing reflectance variations obtained as a result of optical modulation reflectance spectroscopy. In the drawing, the horizontal axis represents photon energy which is inversely proportional to wavelength and the vertical axis represents $\Delta R/R$. As indicated by "SPECTRUM FROM PRE-CLEANING WAFER" in the drawing, the peak value of the spectrum from a pre-cleaning wafer obtained by optical modulation reflectance spectroscopy is high because of the thick natural film formed on the semiconductor region. As indicated by "SPECTRUM FROM CHEMICAL OXCIDE FILM" in the drawing, it will be understood that a considerably thick oxide film exists even when a chemical oxide film is formed by a conventional method, though the peak value is smaller than the former case where the natural oxide film has been formed. If sufficient cleaning is not performed, a peak exists, though it is obscure, as indicated by "SPECTRUM FROM POST-CLEANING WAFER 2". When an oxidation process was performed under this condition, a smaller number of defects were observed in the subsequent reliability evaluation test.

When proper cleaning was performed, the peak of the spectrum obtained by optical modulation reflectance spectroscopy was barely recognizable, as indicated by "SPECTRUM FROM POST-CLEANING WAFER 1" in the drawing. If an oxidation process was performed under this condition, it was proved that defects were seldom produced in the subsequent reliability test. Thus, it will be understood that measurement data obtained by reflectance spectroscopy is usable in judging whether or not the cleaning process involving the etching effect is proper.

Figure 4:
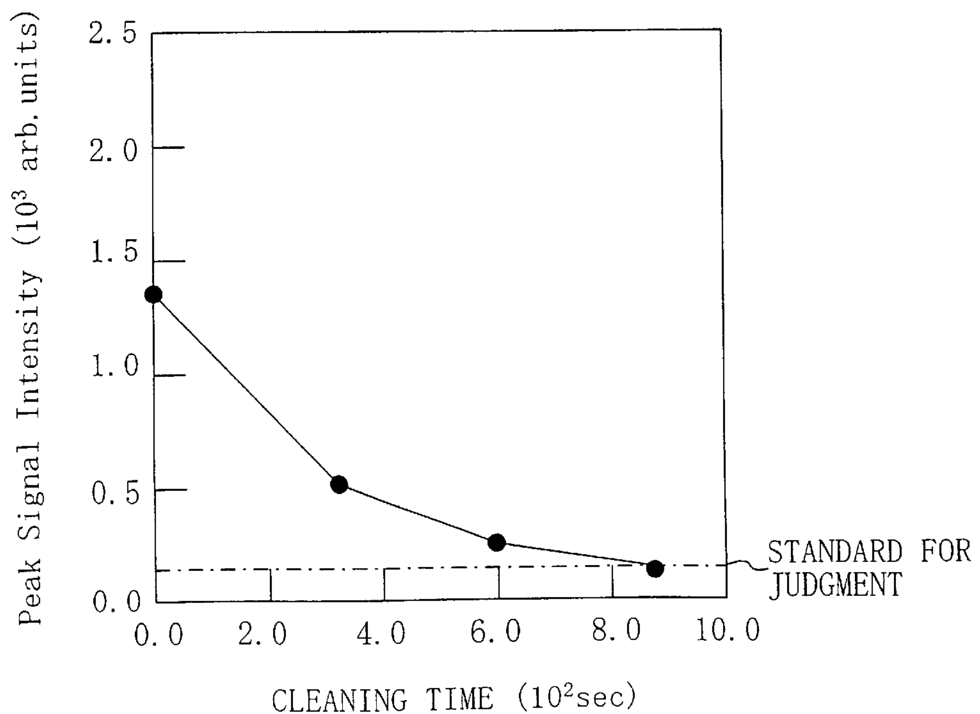
FIG. 4 shows data indicative of the relationship between a cleaning time and a peak value of a spectrum obtained by optical modulation reflectance spectroscopy.

FIG. 4 shows data indicative of the relationship between the cleaning time and the peak value of the spectrum obtained by optical modulation reflectance spectroscopy. As shown in the drawing, the peak value is reduced as the cleaning time is increased, which indicates the complete removal of the natural oxide film.

To say nothing of the case where a conventional unclustered manufacturing device is used, even when a clustered manufacturing device is used, if the oxidation step is performed after cleaning was performed for an empirically determined time, the quality of a gate insulating film may be degraded due to the slightly remaining natural oxide film. By contrast, the process using the manufacturing device according to the present embodiment allows the detection of presence or absence of an extremely thin oxide film on the semiconductor region prior to oxidation after cleaning. As a result, the occurrence of trouble such as a faulty gate insulating film can be prevented positively.

If the oxide film remaining on the wafer after cleaning is detected in the optical measurement chamber 5, the wafer is placed again in the cleaning chamber 1 so that cleaning is performed appropriately for the time required to remove the remaining oxide film. This saves the wafer which might have failed if it had been processed in the subsequent step and allows effective use of the wafer.

Although the present embodiment has set to 0.1 the peak value of the spectrum obtained by optical modulation reflectance spectroscopy, which is used as a standard for a pass/fail judgment prior to oxidation, the standard for evaluation need not necessarily be 0.1 since the standard for evaluation is dependent on the S/N ratio of the measurement system. Instead, a standard for judgment suitable for an individual manufacturing process can be used.

A chemical oxide film may also be formed intentionally after cleaning. In that case, if the proper range of the peak value of the spectrum obtained by optical modulation reflectance spectroscope is predetermined, it becomes possible to control the manufacturing process by detecting a deviation from the proper conditions for the manufacturing process or adjusting the manufacturing conditions or the like. Thus, the method of manufacturing a semiconductor device of the present invention is not limited to the clustered manufacturing device. If the clustered manufacturing device is used, however, the wafer cannot be retrieved from the device till sequential process steps are completed. Hence, such optical evaluation as performed in the clustered manufacturing device in the present embodiment achieves the particularly remarkable effect of judging whether each of the process steps currently performed is proper or not. Since the surface state of the wafer is not affected by environmental conditions outside the device (the presence of oxygen, moisture, or the like), the present invention is advantageous in that it can determine the thickness of a thin oxide film with a thickness of 10 nm or less, while removing the influence of a natural oxide film or the like, thereby achieving higher measurement accuracy.

Although the present embodiment has provided the rapid thermal processing chamber 2 to perform an oxidation process with respect to the wafer, the present invention is applicable to the process of forming an oxynitride film by performing nitriding as well as oxidation and to the process of forming a nitride film by performing only nitriding.

Although the present embodiment has described only the case where the thickness of a film is 2 nm or less, the present invention is not limited thereto. It will be appreciated that the same effect as achieved in the present embodiment can also be achieved provided that the relationship between bedding strength and a film thickness has been predetermined even if the thickness of a film is 2 nm or more.

In principle, it is possible to use ellipsometry that has been used conventionally instead of optical modulation reflectance spectroscopy described in the present embodiment in measuring a film thickness in the clustered manufacturing device. In contrast to ellipsometry which requires the provision of the polarizer and analyzer in the monitoring unit to measure a film thickness, as described above, optical modulation reflectance spectroscopy according to the present invention does not require the provision of the polarizer and analyzer. Hence, the use of optical modulation reflectance spectroscopy is not only advantageous over the use of ellipsometry in that the thickness of a thin film with a thickness of 1.5 nm or less can be measured with high accuracy but also in terms of saving space, since the clustered manufacturing device has only a limited space.

Embodiment 2

Next, a description will be given to a second embodiment related to the control of the thickness of an oxide film during the formation of the oxide film. The present embodiment also assumes the use of the clustered manufacturing device according to the first embodiment, which is shown in FIGS. 1 and 2.

First, wafers to be processed including an advanced wafer (monitor wafer) are transferred from the load/unload port 6 into the load-lock room 3 and cleaned in the cleaning chamber 1 under such conditions as to provide "SPECTRUM FROM POST-CLEANING WAFER 1". The wafers are then moved to the optical measurement chamber 5 in which measurement is performed by optical modulation reflectance spectroscopy.

After the natural oxide films are removed completely from the wafer, the wafers are subjected to oxidation which is performed by different methods for different times. Measurement by optical modulation reflectance spectroscopy is performed for each of the oxidation processes.

Figure 5:
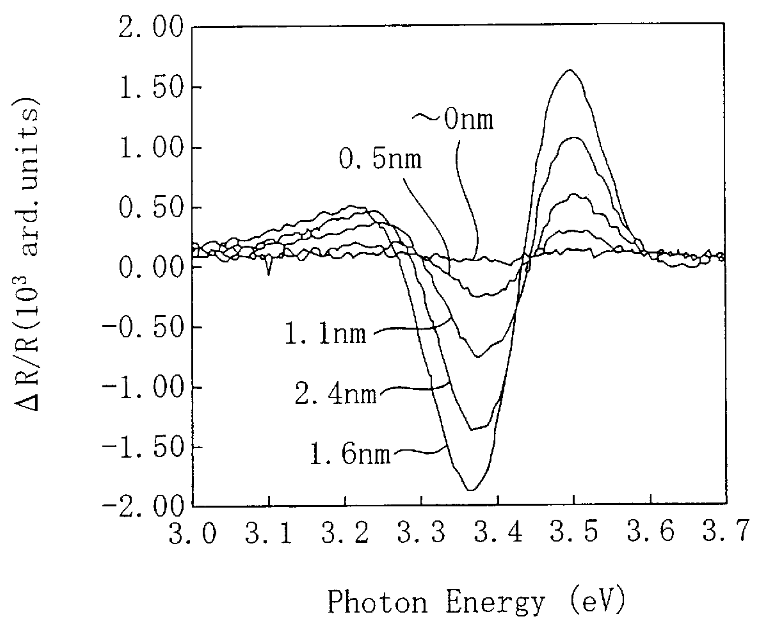
FIG. 5 is a spectral diagram showing the reflectances of various oxide films measured by optical modulation reflectance spectroscopy.

FIG. 5 is a spectral diagram showing the result of measurement performed by optical modulation reflectance spectroscopy in the present embodiment. The film thicknesses shown in the drawing were determined by TEM observation. However, since the peak values in the drawing vary with the SN ratio of the measurement system, as described above, they indicate only relative values with respect to the film thicknesses. As shown in the drawing, peaks were hardly observable in the spectra obtained from the wafers immediately after cleaning and the thicknesses of the oxide films were measured to be approximately 0 nm by TME observation.

Figure 6:
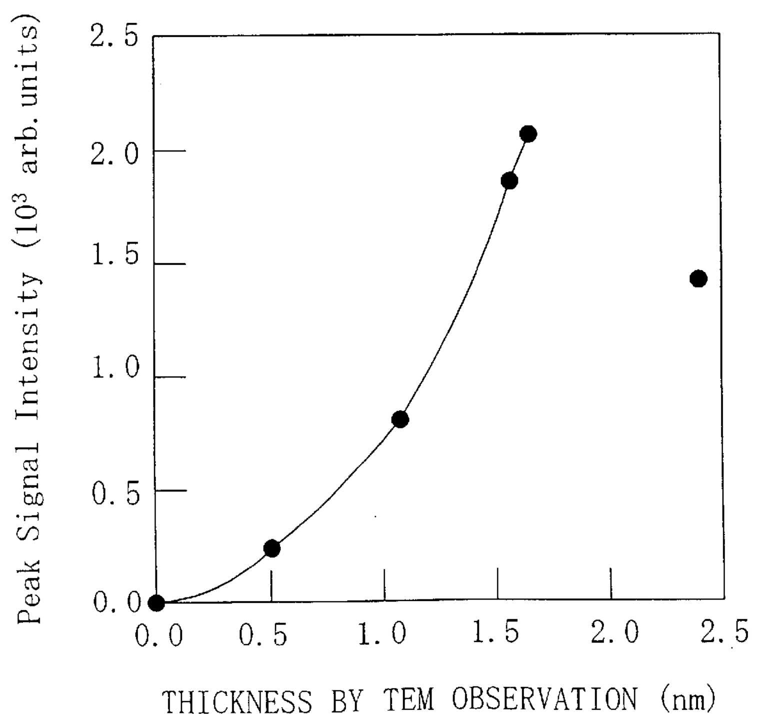
FIG. 6 shows data indicative of the relationship between a film thickness determined by TEM observation and a peak value of a spectrum obtained by optical light modulation reflectance spectroscopy.

FIG. 6 shows data indicative of the relationship between a film thickness determined by TEM observation and a peak value of a spectrum obtained by optical modulation reflectance spectroscopy. As shown in the drawing, the peak value of the spectrum increases as the film thickness increases till the thickness of the oxide film reaches a value close to 2.0 nm. However, the peak value of the spectrum decreases after the thickness of the oxide film exceeds 2.0 nm, as shown in the drawing.

Figure 7:
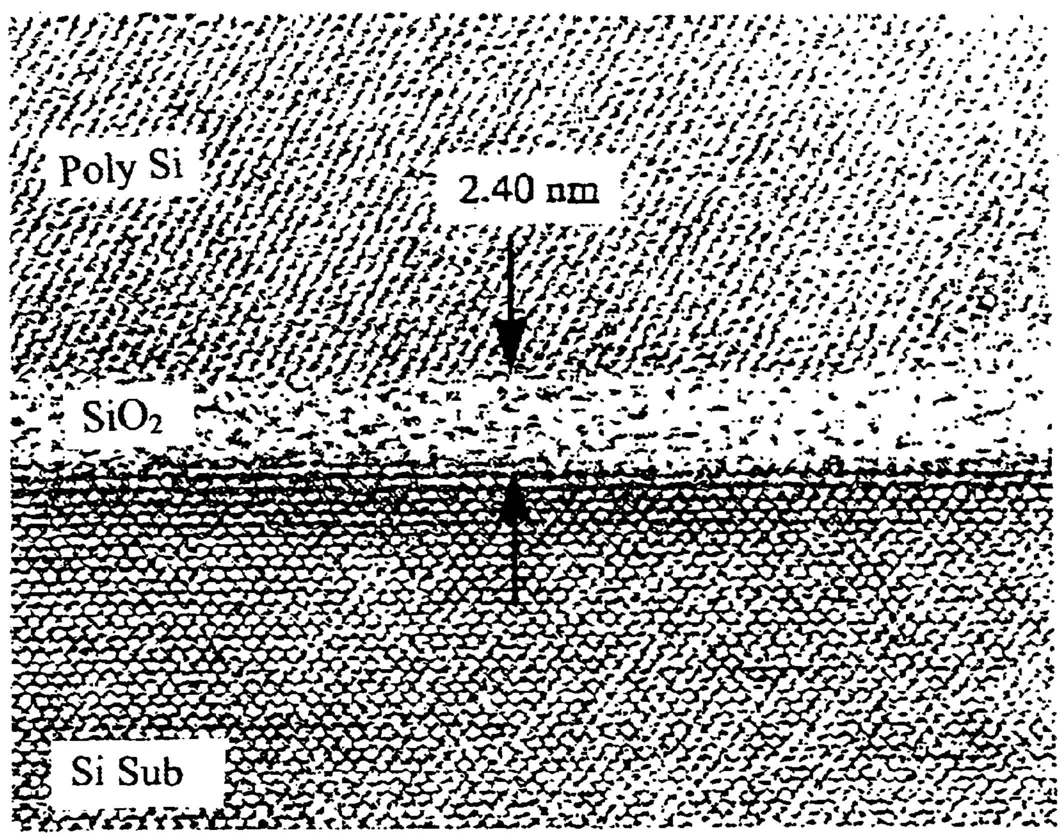
FIG. 7 is a TEM micrograph of a cross-sectional structure in which an oxide film and a polysilicon film are deposited on a silicon substrate.

FIG. 7 is a TEM micrograph of a cross-sectional structure in which an oxide film with a thickness of 2.4 nm and a polysilicon film are deposited on a silicon substrate. As shown in the drawing, the present application has determined the thickness of the oxide film based on the result of TEM observation performed with such a resolution with which the network structure of a silicon oxide film can be observed.

Next, a description will be given to the process of forming an oxide film with a thickness of 1.5 nm with reference to the data. First, a wafer is introduced into a rapid thermal processing furnace 2 into which $O_2$ gas is introduced at a flow rate of 500 sccm and heated to 1000° C. for about 1 minute. By properly adjusting the subsequent retention time, an oxide film with a desired thickness can be formed. In the experiment conducted in the present embodiment, an oxide film with a thickness of about 1.5 nm was obtained after the retention time of about 10 sec. When the optical measurement system was used in the present embodiment, the manufacturing process was controlled by adjusting the peak value of the spectrum obtained by optical modulation reflectance spectroscopy to approximately 1.8 shown in FIG. 6. As a result, only oxide films with varying thicknesses of 1.5 nm±0.2 nm were formed in accordance with the conventional method using a clustered manufacturing device but not using optical measurement for a control operation. By contrast, oxide films with varying thicknesses of 1.5 nm±0.1 nm were formed in the experiment conducted in the present embodiment so that variations in the thickness of the oxide film are limited to the range of ±0.1 nm.

If the oxide film remaining on the wafer after cleaning was detected in the optical measurement chamber 5, the wafer is placed again in the cleaning chamber 1 so that cleaning is performed appropriately for the time required to remove the remaining oxide film. This saves the wafer which might have failed if it had been processed in the subsequent step and allows effective use of the wafer.

The pass/fail judgment of the oxide film described above allows proper procedures to be followed, such as "advance the wafer to the subsequent process," "perform an additional oxidation process," and "remove the oxide film and perform again the whole process from the initial oxidation".

As standard values for controlling the manufacturing process, values appropriate for the circumstances of the process and measurement system are preferably used since whether the standard values are proper or not is determined by various factors.

The measurement method used in the present embodiment is not only applicable to the clustered manufacturing device and method but also to the conventional film thickness control after the oxidation process. By thus incorporating the optical measurement method into the process of forming the insulating film, the film thickness can be determined precisely during the manufacturing process, so that the process of manufacturing an insulating film such as a gate insulating film is controlled more appropriately.

If the clustered manufacturing device is used, in particular, there can be achieved the remarkable effect of judging whether each of the process steps currently performed is proper or not by performing optical evaluation in the clustered manufacturing device as in the present embodiment, since the wafer cannot be retrieved from the clustered device till sequential process steps are completed. Since the surface state of the wafer is not affected by environmental conditions outside the device (the presence of oxygen, moisture, or the like), the present invention is advantageous in that it can determine the thickness of a thin oxide film of 2 nm or less, while removing the influence of a natural oxide film or the like, thereby achieving higher measurement accuracy.

Although the present embodiment has described only the case where the thickness of a film is 2 nm or less, the present invention is not limited thereto. It will be appreciated that the same effect as achieved in the present embodiment can be achieved provided that the relationship between bedding strength and a film thickness has been predetermined even if the thickness of a film is 2 nm or more.

In principle, it is possible to use ellipsometry that has been used conventionally instead of optical modulation reflectance spectroscopy described in the present embodiment in measuring the film thickness in the clustered manufacturing device. However, optical modulation reflectance spectroscopy is advantageous over ellipsometry for the reasons described above in the first embodiment.

Although the present embodiment has provided the rapid thermal processing chamber 2 to perform an oxidation process with respect to the wafer, if the relationship between a film thickness and a peak value of a spectrum obtained by optical modulation reflectance spectroscopy is predetermined, the present invention is also applicable to the process of forming an oxynitride film by performing nitriding as well as oxidation and to the process of forming a nitride film by performing only nitriding.

Embodiment 3

Although the optical measurement system for performing measurement by optical modulation reflectance spectroscopy has been mounted on the optical measurement chamber 5 in the clustered manufacturing device in each of the first and second embodiments, the present invention is not limited thereto. For example, the present invention is also applicable to the following manufacturing device which has not been clustered.

Figure 9:
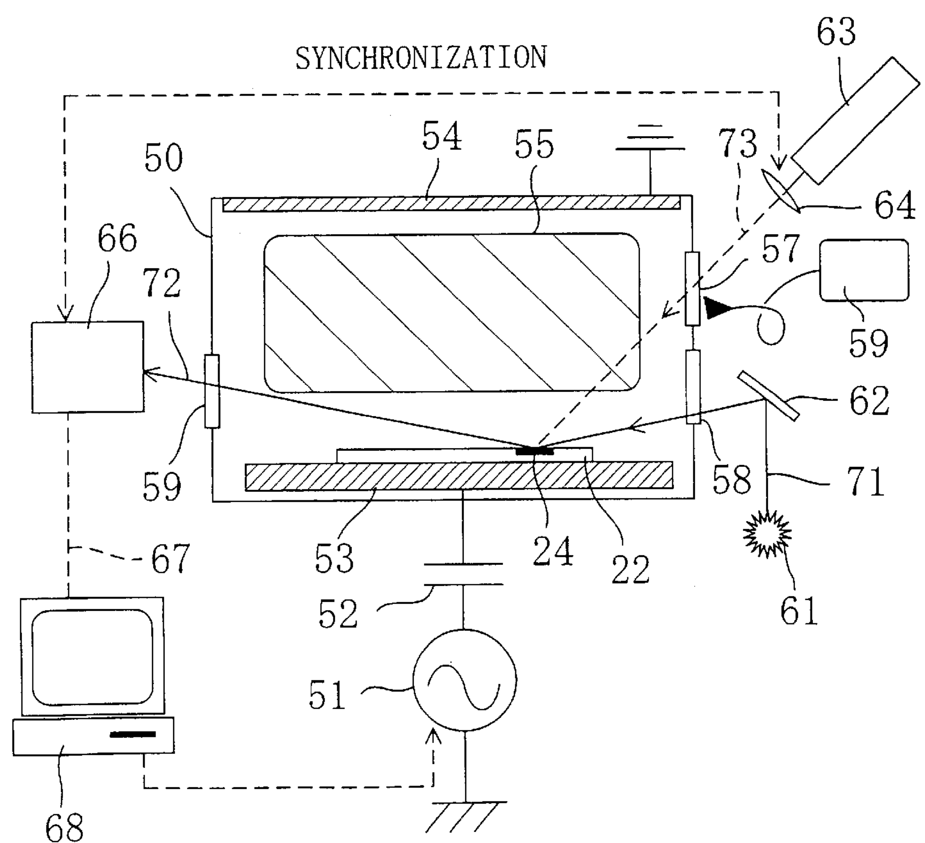
FIG. 9 is a cross-sectional view schematically showing a structure used when optical measurement is performed in a single isolated chamber according to a fourth embodiment of the present invention.

FIG. 9 is a cross-sectional view schematically showing a structure used when optical measurement is performed in a single isolated chamber as an unclustered manufacturing device according to a third embodiment, e.g., a reaction chamber 50 in which plasma CVD is performed. As shown in the drawing, a cathode electrode 53 as a lower electrode and an anode electrode 54 as an upper electrode are disposed in the reaction chamber 50. A wafer 22 made of p-type silicon is placed on the cathode electrode 53. A silicon oxide film (not shown) is formed by CVD on a semiconductor region 24 of the wafer 22. A plasma 55 is generated in the reaction chamber 50 by applying RF power from an RF power source 51 between the electrodes 53 and 54 via a coupling capacitor 52. A wall surface of the reaction chamber 50 is provided with an endpoint detection window 57, a probe light incident window 58, and a reflected light monitor window 59.

On the other hand, an endpoint detection system 59 and members for measuring reflection intensity R are provided externally of the reaction chamber 50. As one of the members, there is provided a Xe lamp 61 for generating probe light with which the semiconductor region 24 is irradiated. Probe light 71 generated from the Xe lamp 61 is reflected by a mirror 61 to pass through the silicon oxide film on the wafer 22 placed in the reaction chamber 50 via the probe light incident window 58 and reach the semiconductor region 24. Reflected probe light 72 from the semiconductor region 24 is extracted to the outside of the reaction chamber 50 from the reflected light monitor window 59 so that the intensity thereof is measured by a reflection intensity measurement system 66 (in particular, the region at a wavelength of about 376 nm and with energy of about 3.3 eV). Data on the reflection intensity measured by the reflection intensity measurement system 66 is transmitted to an etching control system 68 via a signal path 67. There is also provided an Ar ion laser 63 for generating exciting light with which the semiconductor region 24 is irradiated. Exciting light 73 generated from the Ar ion laser 63 is chopped by a chopper 64 at a frequency of 200 Hz and transmitted intermittently. The exciting light 73 is supplied into the reaction chamber 50 via the endpoint detection window 57 and used for intermittent irradiation of the semiconductor region 24. The value ($\Delta R/R$) obtained by dividing, by the reflection intensity R in the absence of the radiation of exciting light 73, the difference $\Delta R$ between the reflection intensities of the reflected probe light 72 in the presence and absence of the radiation of exciting light 73 is detected as the change rate of reflectance by the reflection intensity measurement system 66. Optionally, a polarizer and an analyzer may also be disposed at the probe light incident side and at the probe light reflecting side, respectively.

In the arrangement, a variation in the change rate of reflection intensity is monitored in the reaction chamber in which an insulating film is formed actually by CVD. Even in an unclustered manufacturing device which is a single isolated device for forming a film by CVD, sputtering, or thermal oxidation, therefore, the thickness of the formed film can be measured by using spectra obtained by optical modulation reflectance spectroscopy. In particular, measurement by optical modulation reflectance spectroscopy has the advantage of allowing measurement of large thicknesses which can be measured by currently prevalent ellipsometry only with a large measurement error or small thicknesses which are so difficult to measure by ellipsometry that a sufficient measurement sensitivity is unobtainable.

Embodiment 4

Next, a description will be given to a fourth embodiment related to measurement by optical modulation reflectance spectroscopy performed in n-type and p-type semiconductor regions. As a manufacturing device and an optical measurement system to be used in the present embodiment, those used in the first or third embodiment may be used, though they are not shown in the drawing. For convenience, the following description will be made of a measurement procedure to be followed when a clustered manufacturing device and an optical measurement system shown in FIGS. 1 and 2 are used. However, the unclustered CVD device and optical measurement system shown in FIG. 9 may also be used instead.

Relationship between Thickness of Oxide Film and Measurement Data Obtained by Optical Modulation Reflectance Spectroscopy First, wafers to be processed including an advanced wafer, each having n-type and p-type semiconductor regions, were introduced from a load room 6 and cleaned by the method described above in the second embodiment.

Next, respective surfaces of the wafers were oxidized such that oxide films were formed on the n-type and p-type semiconductor regions. By varying the oxidation time, measurement samples having different thicknesses were formed and the thicknesses of the individual samples were measured by optical modulation reflectance spectroscopy.

Figure 10:
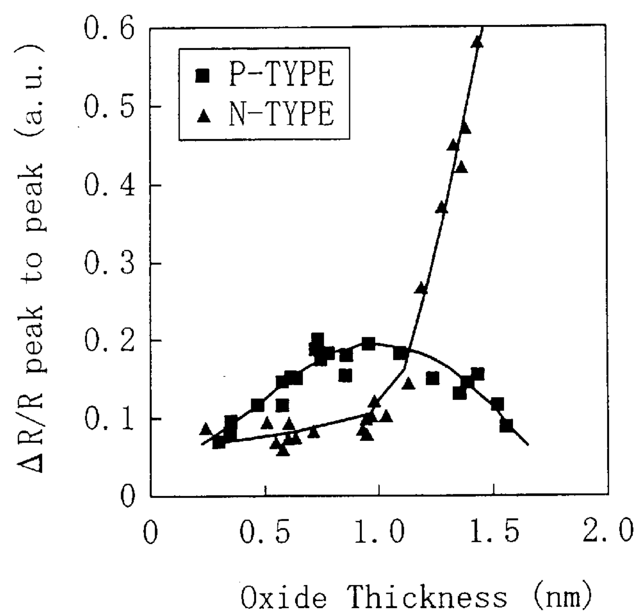
FIG. 10 shows data indicative of the relationship between a film thickness determined by TEM observation and a peak-to-peak value of a spectrum obtained by optical modulation reflectance spectroscopy in a fifth embodiment of the present invention.

FIG. 10 shows data indicative of the relationship between film thicknesses determined by TEM observation and "peak-to-peak values" of spectra obtained by optical modulation reflectance spectroscopy. In the drawing, ■ indicates measurement data on the oxide film on the p-type semiconductor region and ▲ indicates measurement data on the oxide film on the n-type semiconductor region. The "peak-to-peak" value in FIG. 10 shows the difference between the maximum value of a spectrum (positive peak value) and the minimum value thereof (negative peak value).

Figure 11:
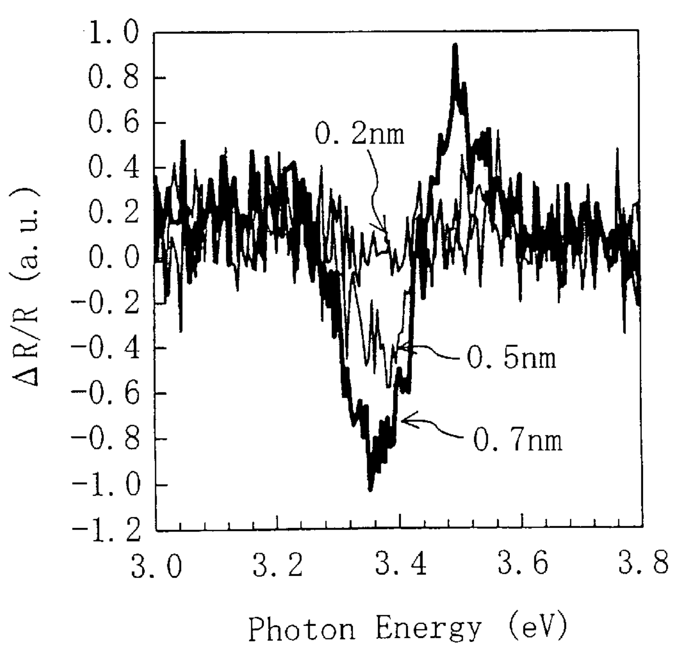
FIG. 11 shows spectra obtained from actual measurement performed in an n-type semiconductor region by optical modulation reflectance spectroscopy in the fifth embodiment.

FIG. 11 shows spectra before a noise removing process is performed with respect thereto, which were obtained from actual measurement by optical modulation reflectance spectroscopy performed in the n-type semiconductor region.

As shown in FIG. 10, the "peak-to-peak value" of the change rate of reflectance ($\Delta R/R$) is higher, i.e., measurement sensitivity is higher in the p-type semiconductor region than in the n-type semiconductor region when the thickness of the oxide film is about 1.0 nm or less. If the thickness of the oxide film is larger than about 1.0 nm, on the other hand, the "peak-to-peak value" is higher in the n-type semiconductor region. If the thickness of the oxide film is over 1.0 nm, the peak-to-peak value tends to decrease in the p-type region.

If the thickness of the oxide film is close to 0.2 nm, a peak portion can be found only with difficulty in the spectra in the n-type semiconductor region due to indentations resulting from noise, as shown in FIG. 11.

The following is a summary of the foregoing data. As the thickness of a gate insulating film increases, the number of electrons captured thereby increases. The phenomenon occurs when the film thickness is in the range of 0 to 2 nm. As shown in FIG. 10, the increase in the change rate of reflectance due to the increased number of captured electrons is particularly remarkable when the thickness is 1 nm or more at the surface of the n-type semiconductor region. On the other hand, the variation in the change rate of reflectance due to the increased number of captured electrons is remarkable when the thickness is in the range of 0.5 to 1.5 nm at the surface of the p-type semiconductor region. Although the varying property of signal intensity is dependent on conditions for the process of forming the film, data on the thickness of the film can be obtained from the varying property of signal intensity.

By using the measurement data in the p-type semiconductor region when the thickness of the oxide film is 1.0 nm or less, while using the measurement data in the n-type semiconductor region when the thickness of the oxide film is over 1.0 nm, in particular, precise measurements can be made on almost all oxide films having thicknesses of 1.5 nm or less, which have been difficult conventionally to measure with precision. The effect is achievable regardless of whether a clustered manufacturing device is used or not.

Control of Thickness of Oxide Film

Next, the result of effecting control of the thickness of an oxide film will be described with reference to data shown in FIG. 10.

Measurement by optical modulation reflectance spectroscopy was made on a gate oxide film on each wafer and the manufacturing process was controlled such that the peak-to-peak value of the spectrum from each wafer becomes a value corresponding to a thickness of 1.5 nm shown in FIG. 10.

Figure 12:
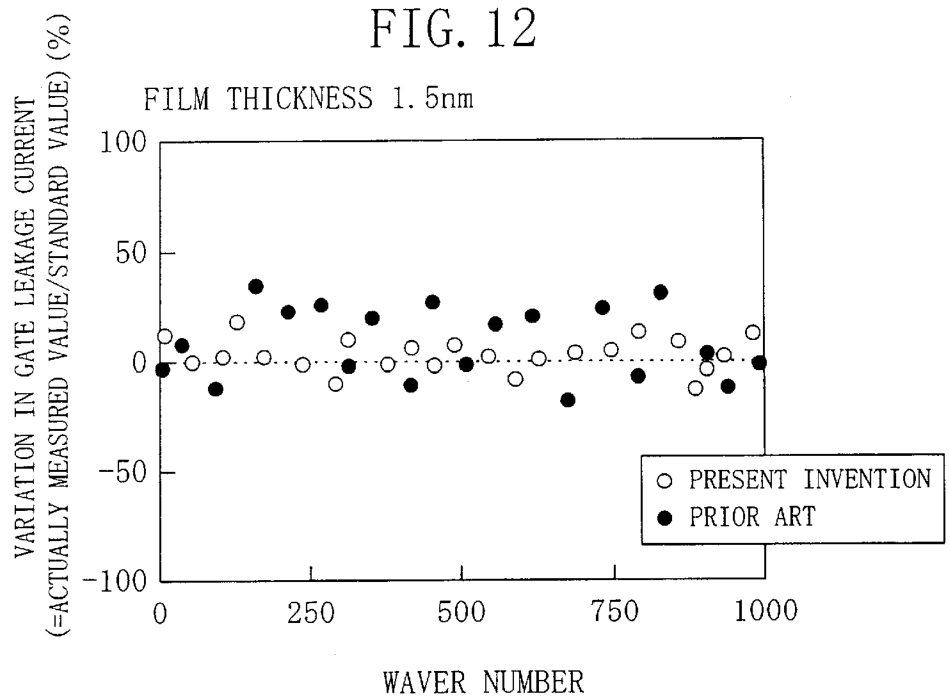
FIG. 12 shows data indicative of variations in leakage current in a gate oxide film controlled in accordance with a method of controlling the thickness of a gate oxide film in the fifth embodiment.

FIG. 12 shows data indicative of variations in leakage current in a gate oxide film controlled by a method of controlling the thickness of a gate oxide film in the present embodiment. In the drawing, the horizontal axis represents a wafer number and the vertical axis represents a variation (%) expressed as the ratio of an actually measured value to the standard value of a gate leakage current. ○ indicates measurement data on a gate leakage current in a device formed by a manufacturing process in which the control method according to the present embodiment has been incorporated and ● indicates a gate leakage current in a device formed by a conventional manufacturing process in which the control method according to the present embodiment has not been incorporated. As shown in the drawing, variations in the thicknesses of the gate oxide films formed by using the control method of the present embodiment are small, so that variations in gate leakage current are also suppressed.

In the empirical conventional method, variations in the thicknesses of gate oxide films increase as the operational time of the manufacturing device increases in the process of forming the gate oxide films each having a thickness on the order of 1.5 nm, so that defects frequently occur in the gate oxide films. In accordance with the method of controlling the thicknesses of gate oxide films of the present embodiment, however, variations in gate leakage current can be reduced so that the occurrence of defects in the gate oxide films is also suppressed. Thus, the method of determining a film thickness and the method of manufacturing a semiconductor device implement a high-performance device having a gate insulating film with a thickness on the order of 1.5 nm.

Control of Cleaning Process

Next, a description will be given to the result of measuring the thickness of an oxide film by using optical measurement in each of p-type and n-type semiconductor regions in a cleaning process (involving the action of removing an oxide film) corresponding to the first embodiment.

In that case, wafers to be processed including an advanced wafer (monitor wafer) are transferred from the load/unload port 6 to the load-lock room 3, similarly toe the cleaning process in the first embodiment, and then cleaned in the cleaning chamber 1 for different times. At this time, the surfaces of the wafers are etched with radicals produced by dissociating $Cl_2$ gas under the radiation of light to form a flat interface. For this purpose, anticorrosive treatment or the like has been performed with respect to the surface of the cleaning chamber 1.

Next, the cleaned wafers are transferred to the optical measurement chamber 5 and subjected to optical measurement by optical modulation reflectance spectroscopy using the optical measurement system shown in FIG. 2.

Figure 13:
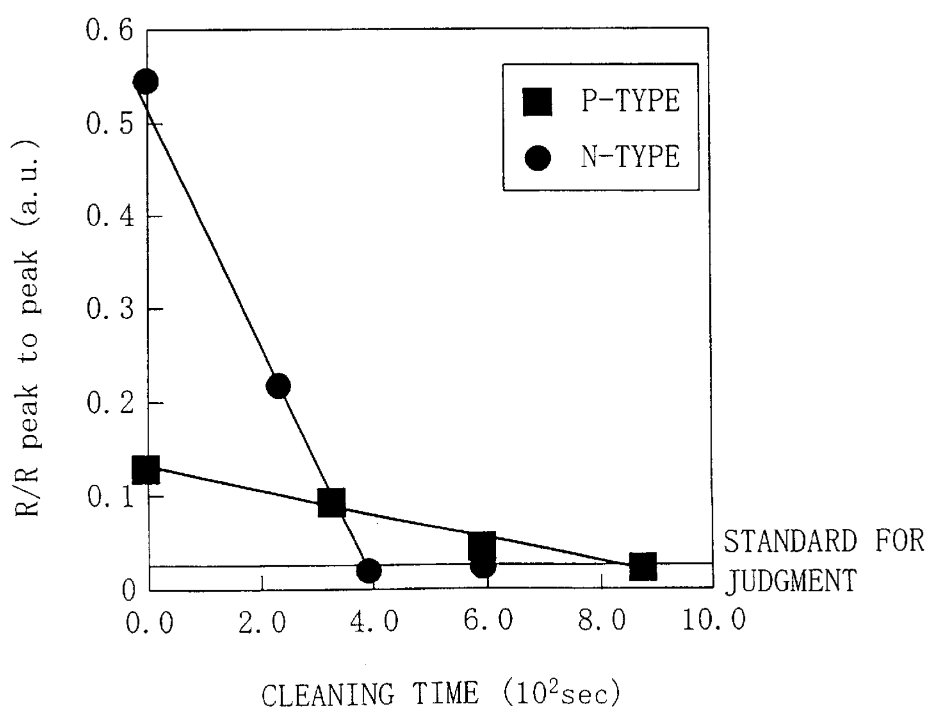
FIG. 13 shows data indicative of variations in the peak-to-peak value of a spectrum obtained by optical modulation reflectance spectroscopy plotted against a cleaning time when wafers are cleaned by using a clustered device according to the fifth embodiment, which is shown in FIGS. 1 and 2.

FIG. 13 shows data representing variations in the "peak-to-peak value" of the spectra obtained by optical modulation reflectance spectroscopy plotted against a cleaning time when the wafers are cleaned by using the clustered device shown in FIGS. 1 and 2. In the drawing, ■ indicates a value measured in the p-type semiconductor region and ● indicates a value measured in the n-type semiconductor region. Although data obtained from the n-type semiconductor region is seemingly different from the data shown in FIG. 4, this is because different methods of processing data are used in FIGS. 4 and 13. Basically, the two sets of data show the same tendency. It will be understood that, in each of the regions, the film thickness is large when the cleaning time is insufficient and the oxide film has not been removed sufficiently and the film thickness is reduced when sufficient cleaning has been performed.

If the two sets of data obtained from the n-type and p-type semiconductor regions are compared with each other, the peak-to-peak value is higher in the n-type semiconductor region till the cleaning time reaches $3.0–4.0\times10^2$ sec. If the cleaning time exceeds $3.0–4.0\times10^2$ sec, however, the peak-to-peak value is higher in the p-type semiconductor region. This indicates that the use of data obtained from the n-type semiconductor region achieves higher measurement sensitivity and higher measurement accuracy if the cleaning time is insufficient and the oxide film is not so thin but the use of data obtained from the p-type semiconductor region achieves higher measurement sensitivity and higher measurement accuracy if the cleaning time becomes longer and the removal of the oxide film proceeds. The tendency coincides with the tendency shown in the data of FIG. 10.

In the cleaning process, therefore, cleaning involving the removal of the oxide film can be performed as necessary and sufficiently by controlling cleaning conditions and cleaning time, while making measurement by optical modulation reflectance spectroscopy on the n-type and p-type semiconductor regions and monitoring the thickness of oxide film based on data ($\Delta R/R$) representing a higher sensitivity.

If variations in values measured during the formation of the oxide film by thermal oxidation or CVD are estimated from the data shown in FIG. 13, it will be understood that the measured values form a characteristic curve with an inclination opposite to that of the characteristic curve shown in FIG. 13 when plotted against the lapse of processing time. By thus using the data shown in FIG. 13, the thicknesses of a thermal oxide film and a CVD oxide film formed on the p-type and n-type semiconductor regions can also be controlled during the film formation process.

Other Embodiments

Although the first and second embodiments have arranged the cleaning chamber 1, the rapid thermal processing chamber 2 for forming the oxide film, the cooling chamber 4, and the optical measurement chamber 5 around the load-lock room 3 in the clustered manufacturing device such that wafers are transferred under reduced pressure without being exposed to an external space between the individual chambers, as shown in FIG. 1, the present invention is not limited thereto. By way of example, clustered manufacturing devices with the following structures can be used instead of the device shown in FIG. 1.

First, instead of separately providing the optical measurement chamber 5, an optical measurement system may also be provided in the wafer cooling chamber 4.

Second, instead of providing the rapid thermal processing chamber 2, a chamber for forming an oxide film, a nitride film, and a polysilicon film by sputtering or CVD may also be provided.

Third, in addition to the rapid thermal processing chamber 2, a chamber for forming an oxide film, a nitride film, and a polysilicon film by sputtering or CVD may also be provided. In particular, if a polysilicon film can be formed within the manufacturing device after the formation of the gate oxide film, a polysilicon film composing a gate electrode can be formed advantageously before a natural oxide film is formed on the wafer formed with a gate oxide film.

It is also possible to provide a part of a wafer with a monitor region in which a semiconductor device as a product is not formed so that the foregoing optical measurement is performed with respect to the semiconductor region within the monitor region. In that case, measurement sensitivity can be increased by achieving a higher impurity concentration in the semiconductor region within the monitor region than in the semiconductor region within the product semiconductor device. Since the monitor region with a large area can be provided, it has the advantage of allowing easy optical measurement.

As a film having a thickness that can be measured by optical modulation reflectance spectroscopy according to the present invention, a film composed of a material having the property of transmitting light (including UV light) may be used appropriately. Accordingly, the film used in the present invention is not limited to an insulating film such as an oxide film. Instead, a film composed of a transparent conductive material or a light-transmitting metal film may also be used. Since a thinner film is more likely to transmit light even though it is made of the same material, restrictions on -materials to which the present invention is applicable are reduced.

As a structure of the optical measurement system suitable for use in a clustered manufacturing device, the following embodiment may also be used.

Figure 14:
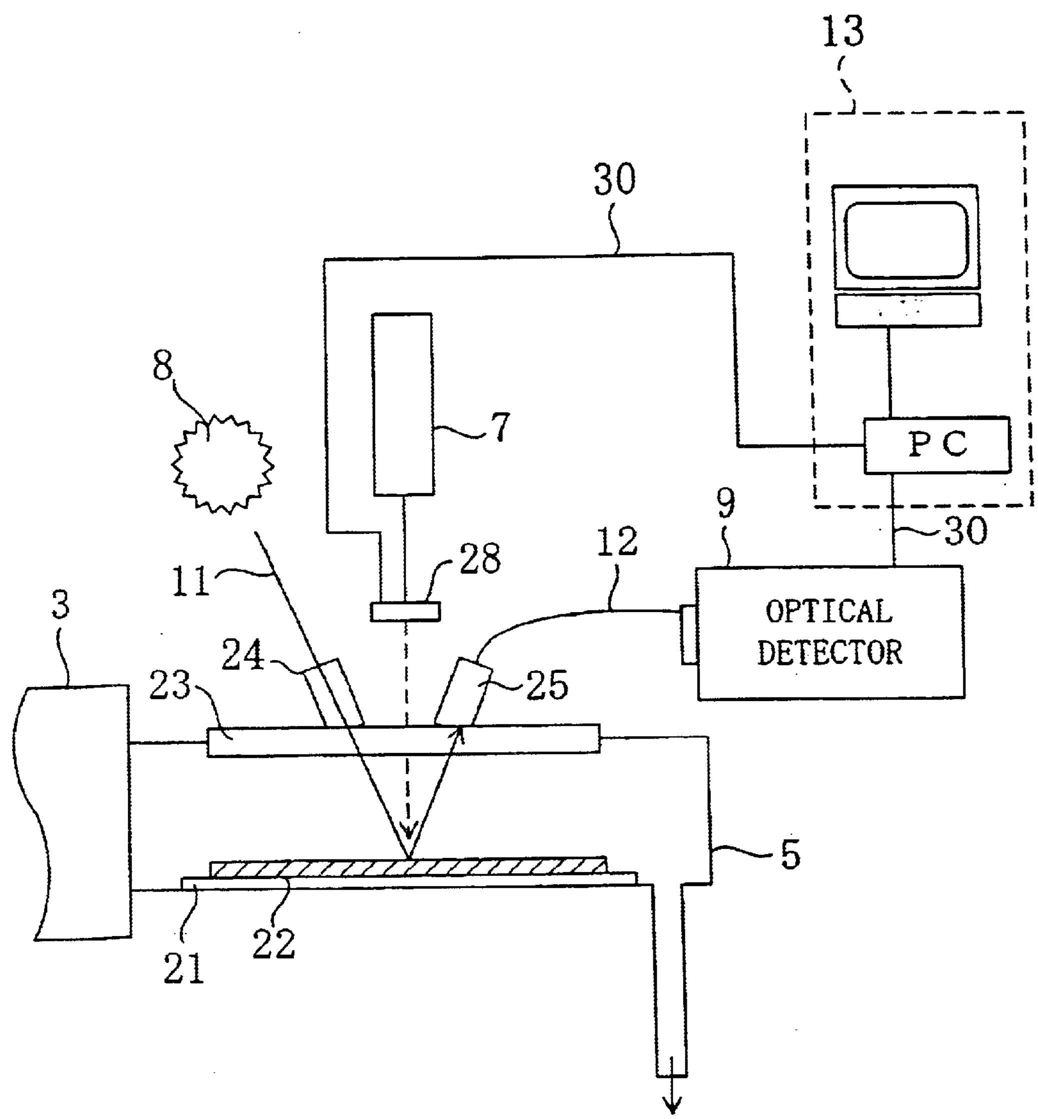
FIG. 14 is a cross-sectional view showing an exemplary structure in which an optical measurement system is disposed collectively on the ceiling side of a chamber in another embodiment of the present invention.

FIG. 14 is a cross-sectional view showing an exemplary structure in which the optical measurement system is disposed collectively on the ceiling side of the chamber. As shown in the drawing, the entire optical system is disposed on the ceiling side of the optical chamber 5 connecting to the load-lock room 3 in the clustered manufacturing device. Specifically, a quartz window 23 for transmitting measuring light and exciting light is mounted on the ceiling side of the optical measurement chamber 5. On the quartz window 23, an incident measuring light inlet 24 and a reflected measuring light outlet 25 are mounted. There are also provided: an exciting light source 7 (Ar ion laser); a measuring light source 8 (150 W Xe lamp); an optical detector 9 for measuring the intensity of reflected measuring light; an optical fiber 11 for guiding the measuring light from the measuring light source 8 to the measuring light inlet 24; an optical fiber 12 for guiding light from the measuring light outlet 25 to the optical detector 9; a chopper 28 for intermittently irradiating an object under measurement with the exciting light at a frequency of 500 Hz generated from the exciting light source 7 (modulation); a control/analyze system 13 having a monitor, a PC, or the like for controlling equipment and calculating/ analyzing data during measurement by optical modulation reflectance spectroscopy; and a signal line 30 for providing a connection between the chopper 28 and the PC of the control/analyze system 13. Each of the incident measuring light inlet 24 and the reflected measuring light outlet 25 has the function as an optical fiber supporter. A wafer 22 is placed on a wafer stage 21 disposed in the optical measurement chamber 5 such that measurement by optical modulation reflectance spectroscopy as described above is performed.

Figure 15:
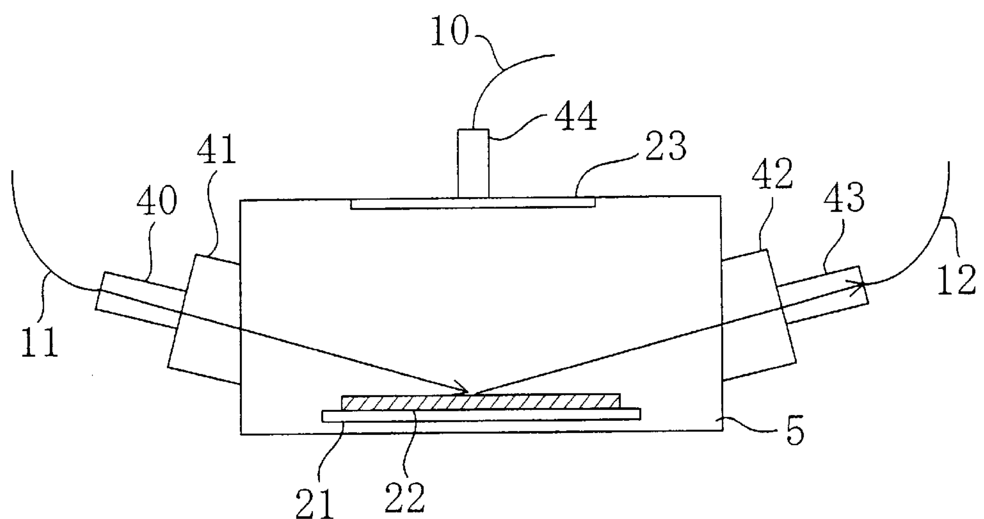
FIG. 15 is a cross-sectional view showing an exemplary structure in which measuring light is incident at an large angle on an object under measurement in still another embodiment of the present invention.

FIG. 15 is a cross-sectional view showing an exemplary structure in which measuring light is incident at a large angle on a sample under measurement. As shown in the drawing, a quartz window 23 for transmitting measuring light and exciting light is mounted on the ceiling side of an optical measurement chamber 5. On the quartz window 23, an optical fiber supporter 44 for introducing exciting light is mounted. On the lateral sides of the optical measurement chamber 5, there are disposed an optical fiber supporter 40 for introducing measuring light, a measuring light inlet 41, a measuring light outlet 42, and an optical fiber supporter 43 for releasing measuring light. Externally of the clustered manufacturing device, there are provided an exciting light source (Ar ion laser), a measuring light source (150W Xe lamp), and an optical detector for measuring the intensity of reflected measuring light, though they are not shown in the drawing. There are also provided: an optical fiber 10 for guiding light from the exciting light source to the optical fiber supporter 44 for introducing exciting light; an optical fiber 11 for guiding light from the measuring light source to the optical fiber supporter 40 for introducing measuring light; and an optical fiber 12 for guiding light from the optical fiber supporter 25 for releasing measuring light to the optical detector. The exciting light is used for intermittent irradiation of the sample under measurement at a frequency of 500 Hz by a chopper placed at a position not shown. There is also disposed a control/analyze system having a monitor, a PC, and the like for controlling equipment and calculating/analyzing data during measurement by optical modulation reflectance spectroscopy.

Figure 16:
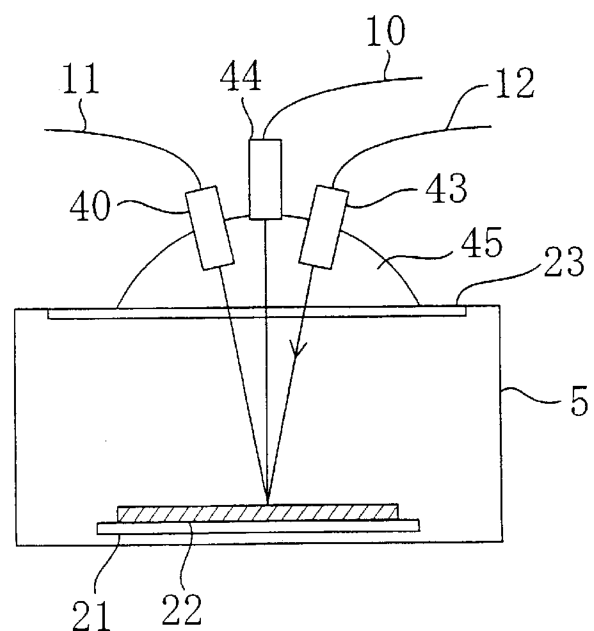
FIG. 16 is cross-sectional view showing an exemplary structure in which an optical measurement system is disposed more integrally on the ceiling side of a chamber in still another embodiment of the present invention.

FIG. 16 is a cross-sectional view showing an exemplary structure in which an optical measurement system is mounted more collectively on the ceiling side of an optical measurement chamber 5. A quartz window 23 is mounted on the ceiling side of the optical measurement chamber 5. A spherical member 45 is mounted on the quartz window 23. The surface configuration of the spherical member 45 is generally coincident with a spherical surface centering around the portion of the wafer 22 under measurement. On the spherical member 45, there are mounted: an optical fiber supporter 40 for introducing measuring light which supports an optical fiber; an optical fiber supporter 41 for releasing measuring light which supports an optical fiber 12; and an optical fiber supporter 44 for introducing exciting light which supports an optical fiber 10. The optical fiber supporter 40 for introducing measuring light and the optical fiber supporter 41 for releasing measuring light are movable along the slope of the spherical member 45, while constantly maintaining the respective tilt angles from the perpendicular at the same value by means of a rack and pinion mechanism or the like. The optical fiber supporter 40 for introducing measuring light and the optical fiber supporter 41 for releasing measuring light are structured such that the respective tilt angles from the perpendicular are adjustable by activating the rack and pinion mechanism under remote control from the outside of the clustered manufacturing device. In other words, the optical fiber supporter 40 for introducing measuring light and the optical fiber supporter 41 for releasing measuring light are structured such that the angle of incidence of the measuring light on the wafer 22 on the wafer stage disposed in the optical measurement chamber 5 is adjustable. In such a structure, the light inlet/outlet portions of the optical measurement system can be disposed collectively in an extremely limited space so that the structure is mounted particularly suitably on a clustered manufacturing device.

What is claimed is:

1. A clustered device for manufacturing a semiconductor device, comprising:

a plurality of processing rooms for processing a wafer having a semiconductor region; a shared container enclosing a space containing the plurality of processing rooms such that the space is held in an atmosphere disconnected from an external space;

transporting means for transporting the wafer within the shared container;

optical measuring means for optically evaluating a surface state of the wafer being disposed at any site in the shared container; wherein the optical measuring means comprises:

a first light source for generating exciting light;

a second light source for generating measuring light;

a first light guiding member for intermittently irradiating the semiconductor region of the wafer in the shared container with the exciting light generated from the first light source;

a second light guiding member for irradiating the semiconductor region with the measuring light generated from the second light source;

reflectance measuring means for measuring the reflectance of the measuring light with which the semiconductor region is irradiated;

a third light guiding member for causing the measuring light reflected by the semiconductor region to be incident upon the reflectance measuring means; and change calculating means for receiving an output of the reflectance measuring means and calculating a change rate of reflectance of the measuring light by dividing the difference between the reflectances of the measuring light when the semiconductor region is irradiated and not irradiated with the exciting light by the reflectance of the measuring light when the semiconductor region is not irradiated with the exciting light.

2. The clustered device for manufacturing a semiconductor device according to claim 1, wherein the plurality of processing rooms including a processing room for performing a cleaning process involving an etching effect with respect to the wafer and a processing room for forming a film on the semiconductor region of the wafer.

3. The clustered device for manufacturing a semiconductor device according to claim 2, wherein the processing room for forming a film on the wafer is so constructed as to form an oxide film by performing a thermal oxidation process with respect to the semiconductor region of the wafer, the clustered device further comprising a processing room for forming a conductor film on the oxide film, the processing room being provided within the shared container.

4. The clustered device for manufacturing a semiconductor device according to claim 1, further comprising an optical measurement room provided within the shared container, wherein the optical measuring means is disposed in the optical measurement room.

* * * * *